United States Patent [19]

van Deursen

[11] 4,392,247

[45] Jul. 5, 1983

[54] BROADCAST RECEIVER WITH SEARCH TUNING

[75] Inventor: Theodorus H. M. van Deursen, Eindhoven, Netherlands

[73] Assignee: U.S. Philips Corporation, New York, N.Y.

[21] Appl. No.: 256,365

[22] Filed: Apr. 22, 1981

[30] Foreign Application Priority Data

May 29, 1980 [NL] Netherlands ......................... 8003087

[51] Int. Cl.³ .............................................. H03J 7/00
[52] U.S. Cl. .................................... 455/161; 455/166; 455/185
[58] Field of Search ............... 455/161, 165, 166, 168, 455/169, 185, 186, 164, 184, 32

[56] References Cited

U.S. PATENT DOCUMENTS

| | | | |
|---|---|---|---|
| 3,913,020 | 10/1975 | Van Anroy | 455/184 |
| 4,217,552 | 8/1980 | Mogi et al. | 455/164 |
| 4,253,194 | 2/1981 | van Deursen | 455/161 |
| 4,285,066 | 8/1981 | van Deursen | 455/165 |
| 4,298,989 | 11/1981 | Someno et al. | 455/161 |

*Primary Examiner*—Jin F. Ng
*Attorney, Agent, or Firm*—Thomas A. Briody; William J. Streeter; Edward W. Goodman

[57] ABSTRACT

A broadcast receiver includes an automatic search tuning arrangement, the tuning being automatically selected on operation of switches which correspond to a number of regions (A . . . F) and other switches which correspond to the chosen program (VF, $P_1$, $P_2$ or $P_3$). These switches cause a control circuit (59) to address a gate circuit (95) to sequentially produce an output corresponding to a subarea of a region to be applied to an address memory (93) of a memory circuit (23). The address memory in turn causes a memory (33, 35, 37 or 39) corresponding to the selected program to produce codes stored therein which correspond to the transmission frequencies of that program and which are used to control the output frequency of a local oscillator (7) via a phase locked loop. The transmission chosen for reception is determined by a count of the number of receivable transmissions corresponding to tuning data from one and the same group.

2 Claims, 1 Drawing Figure

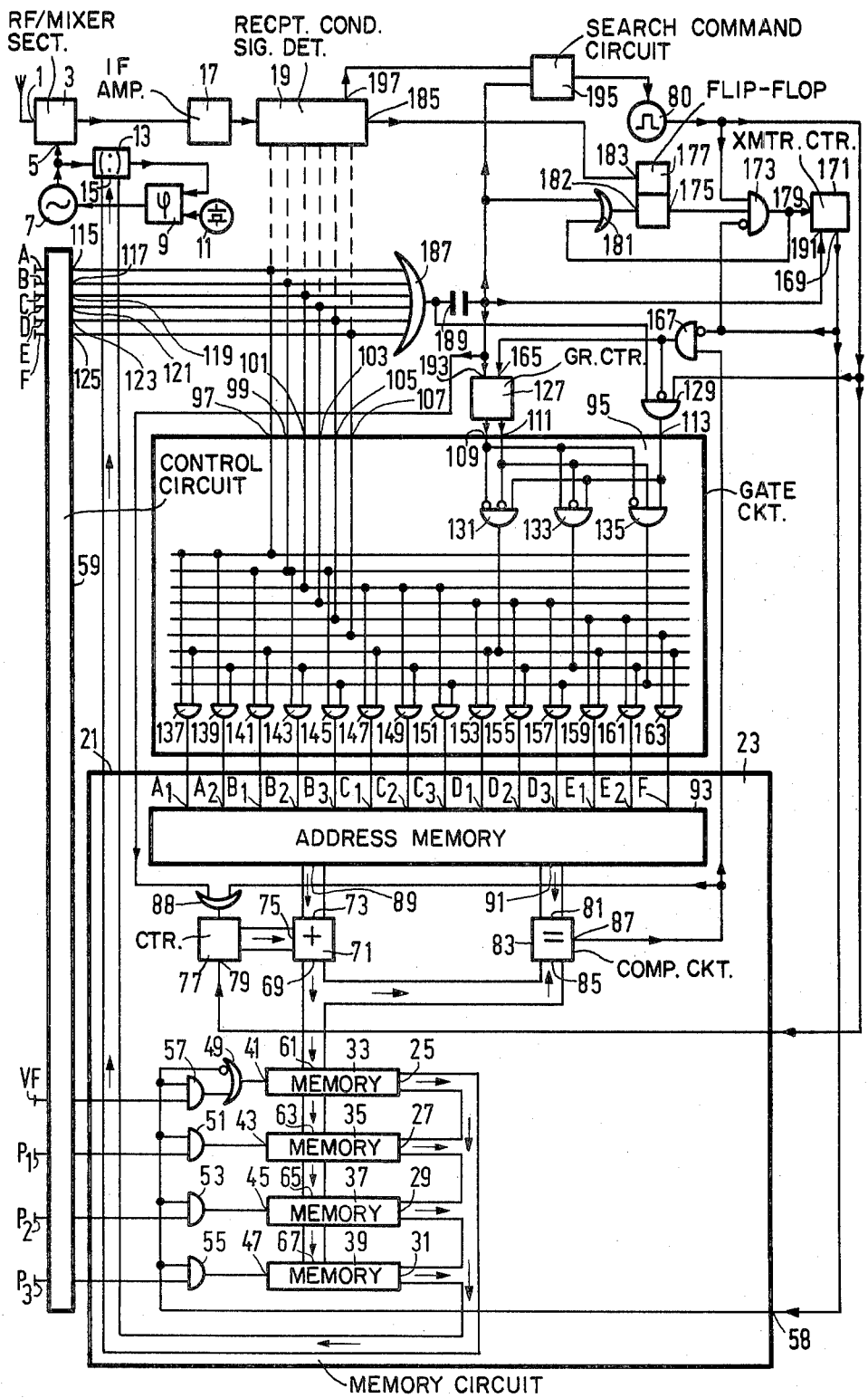

BROADCAST RECEIVER WITH SEARCH TUNING

BACKGROUND OF THE INVENTION

The invention relates to a broadcast receiver including a search tuning circuit comprising a group selection circuit for selecting from a plurality of groups of tuning data stored in a memory circuit a tuning data group associated with a given region, a search action of the search tuning circuit, for scanning a selected group of tuning data, being initiated when a transmission, which corresponds to a tuning datum from the selected group, provides reception which is too weak, the search action being terminated when a transmission, which corresponds to a tuning datum from the selected group, provides sufficiently strong reception.

U.S. patent application Ser. No. 5,121, filed Jan. 22, 1979, now U.S. Pat. No. 4,253,194 issued Feb. 24, 1981, discloses a receiver of the above-mentioned type. The group selection may, for example, be a selection from a plurality of transmission regions of a traffic information system or a selection from a plurality of postal code regions of a broadcast transmission system.

SUMMARY OF THE INVENTION

The invention has for its object to provide a receiver which is simpler to operate.

The invention provides a broadcast receiver of the type described in the opening paragraph which is characterized in that the receiver comprises an automatic control circuit for controlling said group selection circuit which automatically selects, under the control of a transmitter counter, when this counter has counted a sufficient number of transmissions which are receivable with a sufficient strength and which correspond to tuning data from the same group, that particular group.

The use of such automatic group selection simplifies the operation as part of the manual operation is now automated. A reduction of the searching period can be achieved in, for example, a traffic information system, in which a group of tuning data corresponds with a state from a combination of states, only one automatically selected state being scanned by means of a search action instead of the entire combination.

DESCRIPTION OF THE DRAWING

The invention will now be further explained by way of example with reference to the sole FIGURE of the accompanying drawing which shows a block schematic circuit diagram of a receiver according to the invention.

DESCRIPTION OF THE PREFERRED EMBODIMENT

A received radio frequency signal is applied to an input 1 of a radio frequency and mixer section 3. An input 5 of this section receives an oscillator signal from an oscillator 7. The oscillator 7 is tuned by a control signal coming from a phase detector 9, which compares a reference signal coming from a reference oscillator 11 with an output signal of the oscillator 7, the frequency of this output signal being divided by a frequency divider 13. A digital signal combination, which determines the frequency at which the oscillator 7 oscillates and which is used as tuning datum, is applied to an input combination 15 of the frequency divider 13.

An intermediate-frequency output signal of the radio-frequency and mixer section 3 is applied to a reception condition signal detector 19 via an intermediate-frequency amplifier 17.

The tuning datum applied to the input combination 15 of the frequency divider 13 is obtained from an output combination 21 of a memory circuit 23. This output combination 21 is connected to four output combinations 25, 27, 29 and 31 of four memories 33, 35, 37 and 39, respectively.

The memory 33 is a memory for tuning data corresponding to traffic information transmissions, the memory 35 is a memory for tuning data corresponding to transmissions of a first program, the memory 37 for tuning data corresponding to transmissions of a second program and the memory 39 for tuning data corresponding to transmissions of a third program. Which one of the memories 33, 35, 37 or 39 applies a tuning datum to the output combination 21, is determined by a signal which is applied to one of the inputs 41, 43, 45 and 47 of the respective memories 33, 35, 37 and 39, and which is received from an OR-gate 49, an AND-gate 51, an AND-gate 53 or an AND-gate 55, respectively. An input of the OR-gate 49 is connected to the output of an AND-gate 57. An inverting input of the OR-gate 49 and an input of each of the AND-gates 57, 51, 53 and 55 are connected to an input 58 of the memory circuit 23. Each one of the AND-gates 57, 51, 53 and 55 has a further input connected to a corresponding output of a control circuit 59. This control circuit 59 includes a number of control switches VF, $P_1$, $P_2$ and $P_3$ which, when operated, apply a logic one signal to "one" of the corresponding inputs of AND-gates 57, 51, 53 or 55. When the signal at the input 58 of the memory circuit 23 is logic "one", one of the inputs 41, 43, 45, 47 of one of the memories 33, 35, 37, 39, respectively, is adjusted to the logic "one" state and the relevant memory applies a tuning datum to the input combination 15 of the frequency divider 13 via the output combination 21. Input combinations 61, 63, 65, 67, respectively, of the memories 33, 35, 37, 39, respectively are supplied from an output combination 69 of an adder 71 with a signal combination which determines from which location of the relevant memory the tuning datum must have come. In the further course of this description this signal combination will be referred to as the address. This address is determined by the sum of a starting address applied to an input combination 73 of the adder 71 and an additional address, which is received from an address counter 77 and is applied to an input combination 75 of the adder.

In response to a pulse signal produced by a clock signal generator 80 and applied to an input 79, the address counter 77 can pass through a number of positions from zero to a final value, which is determined by a stopping address applied to an input combination 81 of a comparator circuit 83. The address obtained from the output combination 69 of the adder 71 is applied to a further input combination 85 of this comparator circuit 83. When the address at the input combination 85 of the comparator circuit 83 corresponds to the stopping address at the input combination 81, a pulse is produced at an output 87, which resets the address counter 77 to zero via an OR-gate 88, so that the address at the output combination 69 of the adder 71 becomes again equal to the starting address.

So, when the address counter 77 counts, an address which changes from a starting address to a stopping address is applied to the memories 33, 35, 37, 39, causing a group of tuning data to be applied from one of those memories to the frequency divider 13 and the receiver to carry out a transmission search operation.

The starting address and stopping address, which are applied to the input combinations 73 and 81, respectively, of the adder 71 and comparator circuit 83, respectively, are received from output combinations 89 and 91, respectively, of an address memory 93, which has a number of inputs $A_1$, $A_2$, $B_1$, $B_2$, $B_3$, $C_1$, $C_2$, $D_1$, $D_2$, $D_3$, $E_1$, $E_2$ and F. A logic one signal, produced at one of these inputs determines which starting and stopping addresses are supplied at the output combinations 89 and 91 and, consequently, which group of tuning data from the relevant memory 33, 35, 37, 39 is scanned during a search operation. A gate circuit 95, which has a number of inputs 97, 99, 101, 103, 105, 107, 109, 111 and 113 determines which of the inputs $A_1$ to F inclusive, of the address memory is logic "one" and, consequently, which group of tuning data is scanned during a search operation. Thus the signals at the inputs 97 to 113 inclusive, determine which group of tuning data will be scanned during a search operation.

The inputs 97, 99, 101, 103, 105 and 107 of the gate circuit 95 are connected to the respective outputs 115, 117, 119, 121, 123 and 125 of the control circuit 59, which has an additional number of control switches A, B, C, D, E and F by means of which, when operated, one of the outputs 115 to 125 can be adjusted to the logic "one" state. The inputs 109 and 111 of the gate circuit 95 are connected to outputs of a group counter 127 and the input 113 of the gate circuit 95 is connected to an output of an AND-gate 129.

The gate circuit 95 is formed by a number of AND-gates 131, 133, 135, 137, 139, 141, 143, 145, 147, 149, 151, 153, 155, 157, 159, 161 and 163.

The input 97 of the gate circuit 95 is connected to an input of the AND-gates 137 and 139, the input 99 to an input of the AND-gates 141, 143 and 145, the input 101 to an input of the AND-gates 147, 149 and 151, the input 103 to an input of the AND-gates 153, 155 and 157 the input 105 to an input of the AND-gates 159 and 161 and the input 107 to an input of the AND-gate 163. The other respective inputs of the AND-gates 137, 141, 147, 153, 159 and 163 are connected to the output of the AND-gate 131; the other respective inputs of the AND-gates 139, 143, 149, 155 and 161 are connected to the output of the AND-gate 133; and the other respective inputs of the AND-gates 145, 151 and 157 are connected to the output of the AND-gate 135.

The input 109 of the gate circuit 95 is connected to an inverting input of the AND-gate 131, an input of the AND-gate 133 and an inverting input of the AND-gate 135; the input 111 is connected to an inverting input of the AND-gate 131, an inverting input of the AND-gate 133 and an input of the AND-gate 135; and the input 113 is connected to an input of each of the AND-gates 131, 133 and 135. The outputs of the AND-gates 137, 139, 141, 143, 145, 147, 149, 151, 153, 155, 157, 159, 161 and 163 are connected to the respective inputs $A_1$, $A_2$, $B_1$, $B_2$, $B_3$, $C_1$, $C_2$, $C_3$, $D_1$, $D_2$, $D_3$, $E_1$, $E_2$ and F the address memory 93.

A counting input 165 of the group counter 127 is connected to an output of the AND-gate 167 an input of which is connected to the output 87 of the comparator circuit 83 and which is therefore supplied with a pulse each time a stopping address, representing an end of the group of tuning data scanned, is reached during a search action by the counter 77. An inverting input of the AND-gate 167 is connected to an output 169 of a transmitter counter 171, which output is further connected to the input 58 of the memory circuit 23 and to an inverting input of an AND-gate 173. A second input of the AND-gate 173 is connected to an output 175 of a flip-flop 177 and a third input of the AND-gate 173 is connected to the output of the clock signal generator 80. The output of the AND-gate 173 is connected to a counting input 179 of the transmitter counter 171 and to an input of an OR-gate 181, the output of which is connected to a resetting input 182 of the flip-flop 177. A setting input 183 of the flip-flop 177 is connected to an output 185 of the reception condition signal detector 19.

The AND-gate 129 has an input connected to an output of the clock signal generator 80. An inverting input of the AND-gate 129 is connected to the output of the AND-gate 167 while a third input of the AND-gate 129 is connected to an output of an OR-gate 187.

The OR-gate 187 has six inputs which are connected to the respective outputs 115, 117, 119, 121, 123 and 125 of the control circuit 59. Via a differentiating circuit in the form of a capacitor 189, the output of this OR-gate is connected to an input of the OR-gate 181, a resetting input 191 of the transmitter counter 171, a resetting input 193 of the group counter 127 and an input of the OR-gate 88.

The operation of the receiver as regards the automatic selection of a group of tuning data to be scanned during a search action will now be described.

The receiver shown in the drawing is a car radio for the German Federal Republic with a territorial division into states $A_1$, $A_2$, $B_1$, $B_2$, $B_3$, $C_1$, $C_2$, $D_1$, $D_2$, $D_3$, $E_1$, $E_2$ and F, which division has been made for the benefit of traffic information. The control circuit 59 has a number of manually operable control switches A, B, C, D, E and F, with which what is known as a region can be selected. However, a number of regions comprise more than one state, the A region comprising the states $A_1$ and $A_2$, the B region the states $B_1$, $B_2$ and $B_3$ etc. In the receiver, in the memories 33, 35, 37, 39 of the memory circuit 23, a division of tuning data according to states has been made, that is to say a group of tuning data corresponds to a region (so in this case includes all of the states of that region). The control circuit 59 further includes a number of manually operable control switches $P_1$, $P_2$, $P_3$ and VF, by means of which the user can select either transmissions having a given programme $P_1$, $P_2$ or $P_3$, or transmissions giving traffic information VF.

The circuit in the receiver is of such a construction that when a region is selected, for example the region B, a selection of a state, for example $B_1$, $B_2$ or $B_3$ occurs automatically. This automatic selection is made on the basis of the number of receivable traffic information transmissions as will be described hereinafter. During this automatic selection the influence of the control elements VF, $P_1$, $P_2$ or $P_3$ is temporarily removed by means of the AND gates 51, 53, 55 and 57 as during the automatic selection the input 58 of the memory circuit 23 is logic zero and is not adjusted to the logic one state until the automatic selection has ended. The memory 33 is operative via the OR-gate 49 during the automatic selection.

The automatic selection is started by operating one of the control switches A through F, for example B. The relevant output 117 of the control circuit 59 then becomes logic "one" and as a result thereof also the input 99 of the gate circuit 95 and the output of the OR-gate 187. By means of the capacitor 189 a pulse is obtained which resets the flip-flop 177 to zero via the OR-gate 181 and the input 182 and which further resets the transmitter counter 171 via the input 191, the group counter 127 via the input 193 and the address counter 77 via the OR-gate 88, to their respective zero positions. The input of the AND-gate 129, which is connected to the output of the OR-gate 187, then also becomes logic "one".

Furthermore, the inverting input of the AND-gate 129 is logic "one" since the AND-gate 167 produces a logic "zero" signal since the output 87 of the comparator circuit 83 is logic "zero". The AND-gate 129 now applies clock pulses to the input 113 of the gate circuit 95. These clock pulses are applied to an input each of the AND-gates 131, 133, 135. One of these AND-gates 131, 133, 135 conducts during the occurrence of these clock pulses depending on the position of the group counter 127. For the described case, the position of this counter 127 is zero since it has just been set to zero. The AND-gate 131 now passes clock pulses which are applied to the input $B_1$ of the address memory via the AND-gate 141, as the AND-gate 141 is supplied with a logic "one" signal from the output 117 of the control circuit 59 and the clock pulses from the AND-gate 131. At the output combinations 89 and 91, respectively, the address memory 93 now produces a start address and a stop address associated with a group of tuning data.

Because of the fact that the transmitter counter 171 has been set to zero, its output 169, and consequently the input 58 of the memory circuit 23, has become zero so that, as described above, only the memory 33 can apply tuning data to the frequency divider 13. This is done under the control of the address counter 77 which is controlled by the clock generator 80 and supplies, from its output combination, an address cycle which extends from a start address obtained from the output combination 89 of the address memory 93 to the stop address obtained from the output combination 91, whereafter the address counter 77 is reset to zero via the gate 88 by the signal at the output 87 of the comparator circuit 83.

The receiver is now successively tuned by the tuning data, associated with the address cycle, of the group $B_1$. When a transmission of a sufficient signal intensity is received the reception condition signal detector 19 produces a logic "one" causing the flip-flop 177 to be set to its "one" state and the AND-gate 173 to pass a clock pulse on to the transmitter counter 171 and to an input of the OR-gate 181. This increases the position of the transmitter counter 171 by one and the flip-flop 177 is reset to zero. Each time a transmission of a sufficient intensity in the group $B_1$ is received, the counting position of the transmitter counter 171 is increased by one. When a sufficient number of transmissions have been received, the output 169 of the transmitter counter 171 becomes logic "one", which causes the AND-gate 173 to become non-conductive and the transmitter counter 171 to stop. The AND-gate 167 now remains non-conductive and no signal which might change the position of the group counter 127 is applied to the input 165 of this group counter 127. The group $B_1$ has now been definitely selected as the group having sufficient transmissions which can be scanned during a search action. Since the output 169 of the transmitter counter 171 has become "one" the input 58 of the memory circuit 23 is now also in the "one" state and the memory, which corresponds to the control switch VF, $P_1$, $P_2$ or $P_3$ which has been operated enabling the corresponding AND-gate 57, 51, 53 and 55, is started for a search action.

A search action, as the result of the fact that a transmission is no longer received, can now be carried out under the control of a search command circuit 195, which receives a start-stop signal from an output 197 of the reception condition signal detector 19, and, via the capacitor 189, receives a signal which converts this start-stop signal, during a predetermined period of time after one of the control switches A to F has been operated, into a start signal. The output signal of the search command circuit 195 renders the pulse generator 80 operative during the occurrence of a start signal and inoperative during the occurrence of a stop-signal. As a result thereof a search action can be carried out in the group of tuning data $B_1$ of one of the memories 33 through 39.

If after the control element B has been operated an insufficient number of received transmissions are counted by the transmitter counter 171 during the automatic group selection, then the output 169 of the transmitter counter 171 remains in the zero position and the inverting input of the AND-gate 167 remains in the "one" state. When the comparator circuit 83 indicates, by means of a pulse from the output 87, that the stop-address has been reached, then this pulse is applied to the input 165 of the group counter 127 via the AND-gate 167 and the group counter 127 is set to the position one, which causes its output 109 to become "one" so as to prime the AND-gate 133.

However, during the occurrence of the pulse at the output 87 of the comparator circuit 83, the AND-gate 129 is rendered non-conductive via its inverting input so that then also the AND-gates 131, 133, 135 are non-conducting.

After the pulse from the output 87 the AND-gate 143 applies clock pulses to the input $B_2$ of the address memory 23 in response to which a group $B_2$ of tuning data in the memory 33 is scanned and when a sufficient number of transmissions are received in this group because of the fact that the AND-gate 167 is cutoff by the signal at the transmitter counter output 169 this group is selected for carrying out search actions.

If the $B_2$ group also does not furnish a sufficient number of receivable transmissions then the counting position of the group counter 127 is increased again by the signal at the output 87 of the comparator circuit 83. The outputs 109 and 111 are then zero and one respectively, and the AND-gate 135 passes clock pulses which are applied to the $B_3$ input of the address memory via the AND-gate 145.

During the automatic group selection operation a signal is produced at the output 185 of the reception condition signal detector 19 when a transmission is received. This signal can be obtained from a transmitter identification signal (Senderkennung) or from a region identification signal (Bereichskennung); in the latter case data about the state of the switches A through F is required, which renders the broken line connections necessary.

A state in a different region is automatically selected in a similar manner. The F-region has no teritorial divisions.

In the embodiment shown in the drawing the group selection for the traffic information transmissions is coupled to the group selection for the programme transmissions. The automatic group selection is carried out by means of traffic information transmissions which then also holds for the programme transmissions. This is attractive for car radios but is not a requirement for the use of the invention.

It will be clear that by extending the counter 127 and the number of AND-gates at the output thereof the automatic group selection can be extended to a larger number of groups and that, if so desired, the manual selection feature can be omitted. A combination of automatic and manual group selection as, for example, described above simplifies the circuit.

It will further be clear that it is not necessary to perform the automatic group selection on the traffic information transmissions. The tuning data of the programme transmissions can also be divided in groups on a regional basis and an automatic selection of a region can then be performed on the programme transmissions.

For receivers for domestic use the group division on the basis of traffic information regions and the traffic transmission selection (VF) may be omitted and the territorial division may, for example, correspond to postal code areas or to states or provinces.

It is further possible to incorporate the transmitter counter in a circuit which indicates a ratio between the number of transmissions received and the number of transmitters in a region, which ratio then furnishes, above a predetermined value, the signal which is now obtained from the output 169 of the transmitter counter.

The automatic group selection increases the ease of operation and limits the number of transmitters transmitting a certain programme to be scanned during a search action, so that the search action may proceed more rapidly than when no automatic group selection were performed, while no transmission identification signal is then required.

It will be clear that the tuning circuit of the receiver may, if so desired, be of a different construction so long as tuning by means of a tuning datum from a memory is possible.

A portion of the circuit of the receiver may, if so desired be of a construction which utilizes a microprocessor, not all functions then being simultaneously performed.

What is claimed is:

1. A broadcast receiver including a search tuning circuit comprising a group selection circuit for selecting from a plurality of groups of tuning data stored in a memory circuit, each group of tuning data being associated with a given region, a search action of the search tuning circuit for scanning a selected group of tuning data being initiated when a transmission which corresponds to a tuning datum from the selected group provides reception which is too weak, the search action being terminated when a transmission which corresponds to a tuning datum from the selected group provides sufficiently strong reception, characterized in that the receiver further includes an automatic control circuit comprising means for activating said group selection circuit to select one of said groups of tuning data, a transmitter counter, means for initializing said transmitter counter and for activating said search tuning circuit for scanning said selected group of tuning data for a transmission that would provide sufficiently strong reception, means for incrementing said transmitter counter each time a transmission is accepted and for continuing said scanning by said search tuning circuit until said entire selected group of tuning data is scanned, means for causing said group selection circuit to select said selected group of tuning data if the number of accepted transmissions in said selected group of tuning data, as indicated by said transmitter counter, is equal to or exceeds a predetermined number, and means for reactivating said group selection circuit to select another one of said plurality of groups of tuning data for scanning if the number of accepted transmissions in said selected group of tuning data, as indicated by said transmitter counter, is less than said predetermined number, whereby said automatic control circuit automatically selects for reception, under the control of said counter, when this counter has counted a sufficient number of transmissions which are receivable with sufficient strength and which correspond to tuning data from the same group, that particular group.

2. A receiver as claimed in claim 1, characterized in that said automatic control circuit further comprises a manual control circuit.

* * * * *